United States Patent
Zhou et al.

(10) Patent No.: US 9,720,770 B2
(45) Date of Patent: Aug. 1, 2017

(54) METHOD FOR CALCULATING RAIDS PARITY CODE ON INTERLEAVING AND OUT OF ORDER DATA STREAMS, AND A SYSTEM USING THE SAME

(71) Applicant: Shannon Systems Ltd., Shanghai (CN)

(72) Inventors: Zhen Zhou, Shanghai (CN); Xueshi Yang, Cupertino, CA (US)

(73) Assignee: SHANNON SYSTEMS LTD., Shanghai (CN)

( * ) Notice: Subject to any disclaimer, the term of this patent is extended or adjusted under 35 U.S.C. 154(b) by 0 days.

(21) Appl. No.: 15/021,993

(22) PCT Filed: Sep. 16, 2013

(86) PCT No.: PCT/CN2013/001074
§ 371 (c)(1),
(2) Date: Mar. 15, 2016

(87) PCT Pub. No.: WO2015/035536
PCT Pub. Date: Mar. 19, 2015

(65) Prior Publication Data
US 2016/0224420 A1 Aug. 4, 2016

(51) Int. Cl.
*G06F 11/00* (2006.01)
*G06F 11/10* (2006.01)
(Continued)

(52) U.S. Cl.
CPC ............ *G06F 11/1068* (2013.01); *G06F 3/06* (2013.01); *G06F 3/064* (2013.01); *G06F 3/0619* (2013.01);
(Continued)

(58) Field of Classification Search
None
See application file for complete search history.

(56) References Cited

U.S. PATENT DOCUMENTS 5,799,140 A * 8/1998 Niijima ............... G06F 11/1076
711/100
5,974,503 A * 10/1999 Venkatesh .......... G06F 11/1076
348/E5.008
(Continued)

FOREIGN PATENT DOCUMENTS

| CN | 102023809 | 4/2011 |
| CN | 102023815 | 4/2011 |
| CN | 102915212 | 2/2013 |

OTHER PUBLICATIONS

International Search Report issued in application No. PCT/CN2013/001074.

*Primary Examiner* — M. Mujtaba Chaudry
(74) *Attorney, Agent, or Firm* — McClure, Qualey & Rodack, LLP

(57) ABSTRACT

A storage system for constructing RAID on the basis of flash memory comprises: one or more RAID processors and a plurality of flash memories. The RAID processor comprises a plurality of read-and-write processing units, a data block pointer unit, a data block counter and a parity check code buffer. One read and write processing unit can control one or more flash memory units. A method for constructing RAID in a storage system on the basis of flash memory can realize the function of RAID in a very small logic area and approximately negligible time and realize the unification of the function and performance of a storage system such as an enterprise-level SSD.

9 Claims, 4 Drawing Sheets

(51) Int. Cl.
*G06F 3/06* (2006.01)
*G11C 29/52* (2006.01)
(52) U.S. Cl.
CPC .......... *G06F 3/0688* (2013.01); *G06F 11/108* (2013.01); *G11C 29/52* (2013.01)

(56) References Cited

U.S. PATENT DOCUMENTS

| | | | |
|---|---|---|---|
| 6,230,200 B1* | 5/2001 | Forecast | G06F 9/50 709/219 |
| 6,542,960 B1 | 4/2003 | Wong et al. | |
| 6,625,750 B1* | 9/2003 | Duso | G06F 11/2028 714/11 |
| 9,201,731 B2 | 12/2015 | Burd et al. | |
| 2010/0211841 A1* | 8/2010 | Cao | H03M 13/1102 714/748 |
| 2012/0072680 A1* | 3/2012 | Kimura | G06F 11/108 711/154 |
| 2012/0131265 A1 | 5/2012 | Koltsidas et al. | |

* cited by examiner

| Channel 0 | 1 | 2 | 3 | Parity | |
|---|---|---|---|---|---|
| D0 | D1 | D2 | D3 | D4 XOR(D0,D1,D2,D3) | RAID stripe 0 |
| D5 | D6 | D7 | D8 | D9 XOR(D5,D6,D7,D8) | RAID stripe 1 |
| D10 | D11 | D12 | D13 | D14 XOR(D10,D11,D12,D13) | RAID stripe 2 |
| D15 | D16 | D17 | D18 | D19 XOR(D15,D16,D17,D18) | RAID stripe 3 |
| D20 | D21 | D22 | D23 | D24 XOR(D20,D21,D22,D23) | RAID stripe 4 |
| D25 | D26 | D27 | D28 | D29 XOR(D25,D26,D27,D28) | RAID stripe 5 |
| D30 | D31 | D32 | D33 | D34 XOR(D30,D31,D32,D33) | RAID stripe 6 |
| D35 | D36 | D37 | D38 | D39 XOR(D35,D36,D37,D38) | RAID stripe 7 |

Flash block →

FIG. 1

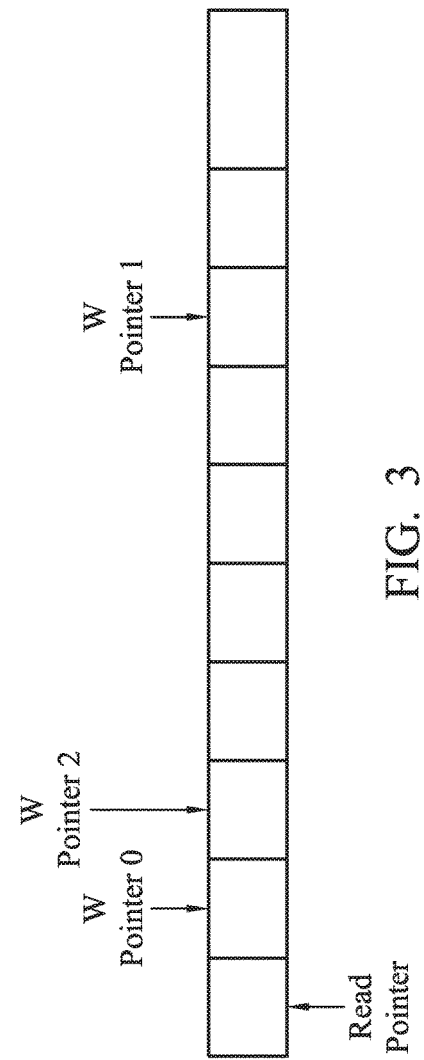

METHOD FOR CALCULATING RAIDS PARITY CODE ON INTERLEAVING AND OUT OF ORDER DATA STREAMS, AND A SYSTEM USING THE SAME

CROSS REFERENCE TO RELATED APPLICATIONS

This application claims the benefit of WIPO Application No. PCT/CN2013/001074, filed on Sep. 16, 2013, the entirety of which is incorporated by reference herein.

TECHNICAL FIELD

The disclosure generally relates to a method for constructing RAID in a storage system on the basis of flash memory, and a system that applies the method.

BACKGROUND

Data storage technology based on NAND Flash memory has continued to develop quickly over the past ten years. The traditional hard disk drive (HDD) has been replaced in many applications. The main reasons for this include:

High Speed: Data storage in a flash memory is different from the traditional HDD, which depends on the mechanical address operation of the magnetic head. Therefore, the speed of reading and writing data is substantially increased, and the strict requirements regarding data storage through put of applications is met.

Decreasing Price: Due to the progress being made in the field of semiconductor technology, flash memory storage capacity has doubled in less than two years, according to Moore's Law, and the price per storage unit has also decreased. Recently, the price for MLC flash memory has decreased from $10 USD/GB, which was the price five years ago, to less than $1 USD/GB.

Progress Of The Technology Of The Controller: The flash memory needs a matching controller to communicate with the host for storing, reading, and writing data. The mature development of the controller technology has contributed to the solid storage technology based on flash memory so that it can be applied in various corresponding areas, which includes applications for high-end data centers and mobile smartphones.

The flash memory controller is the key portion of the solid state disk (SSD) system. The features and functions of the flash memory controller dictate the features and functions of the SSD, and they are also the substantial difference between the consumer-level SSD and enterprise-level SSD. Due to the need to protect data, the calculation and writing of the Redundant Array of Independent Disks (RAID) is necessary for the enterprise-level SSD.

Due to the higher price of the flash memory, the RAID method such as mirroring (i.e. RAID-1) is not acceptable in an ordinary application environment. RAID 5 is usually utilized in the SSD, which means that n data blocks generate a check block (n>>2). If the data is D0, D1 ... Dn, the parity check code will be the Exclusive Or (XOR) of the D0, D1 ... Dn, i.e., P=D0^D1^ ... ^Dn. The data structure of RAID 5 will be taken as an example in the present invention. It should be noted that the method and the system may also be applied in other RAID structures, such as RAID 6.

A main feature of the flash memory is that it cannot be re-written. A page of data stored in the flash memory could be written with new data only after the whole block where the page exists is erased. This presents a challenge for the flash memory transform level (FTL), but it is an opportunity for RAID. The addition and enlarging of RAID does not exist anymore. The method of implementing RAID dynamically in SSD is illustrated in detail in CN patent application 201210256754.4 of "Dynamic Redundant Array Of Independent Disks (RAID) Storage System And Method On The Basis Of Nonvolatile Memory".

The data structure of RAID 5 of SSD is illustrated in FIG. 1. The data block D0, D1, D2 and D3 form a RAID data band, and D0, D1, D2 and D3 are operated by XOR to generate the parity check code D4. Usually, D0, D1, D2, D3 and D4 are stored in different flash memory units, i.e., in the Logic Unit Number (LUN), in order to make sure that data can be repaired by the XOR operation when any flash memory LUN fails.

Recently, there have been two main kinds of SSD. One kind of SSD is the consumer-level SSD, without the RAID 5 function. The other kind of SSD is the enterprise-level SSD, which includes the RAID 5 function. The performance of the enterprise-level SSD for the combination of reading and writing is not good enough.

In order to achieve high performance, the utilization of large-scale parallel multi-core multi-thread controllers which are completely customized is necessary for controlling the flash memory. Each LUN could operate parallel and independently. The calculation and writing of RAID 5 include the following considerations: the data transmitted from the host is random, and the instruction transmitted later could be executed earlier; data transmitted from the host is interleaving, transmission of a data block does not finish while another data block has started transmission, and a portion arrives in advance; writing of the parity check code is asynchronous; when the flash memory capable for check apparatus needs writing, the check code is not necessarily prepared, and when the check code is prepared the read-and-write processing unit is not necessarily prepared; the width of RAID 5 (the amount of data block for forming a RAID data band, or the amount of flash memory LUN) is different in accordance with different applications; a read-and-write processing unit could control multiple flash memory chips which may result in the possibility of locking and increase the difficulty of distribution.

The problems solved by the present invention include: how to reduce the performance penalty caused by the calculation of RAID 5 to achieve the high performance of the storage system such as SSD; how to reduce logical area of RAID 5 to meet the downsizing of the control unit of the storage system such as SSD.

SUMMARY OF THE INVENTION

The present invention provides a method for constructing RAID in a storage system on the basis of flash memory. It can realize the RAID 5 function in a very small logic area and time which could almost be ignored, so that the unity of performance and function of a storage system of the enterprise-level SSD could be realized. The method includes: submitting a check code scheduling instruction to a RAID processor; reading a portion of the data of the data block of a current data band by a read-and-write processing unit of the RAID processor; setting a data block pointer to record the input position of a current data band corresponding to each respective flash memory unit; calculating a parity check code for the portion of data block read by the read-and-write processing unit according to the position of the current data block pointer, and writing the result to a corresponding position of a parity check code buffer;

increasing length value of input portion of data block by the data block pointer; after finishing operation of all data block of a corresponding flash memory unit which means that the data block pointer returns to zero, increasing the amount of finishing data blocks by one; when a recorded amount of finishing data block achieves sum of amounts of data block included by the RAID data band, writing data in a parity check code buffer to a corresponding flash memory unit; and after all check codes are taken, resetting the check code buffer to zero, and starting calculation of the next RAID data band until finishing data operation.

In addition, a scheduling instruction of the check code is transmitted after submitting all of data scheduling instructions of a current RAID data band and before data scheduling instructions of the next RAID data band.

Furthermore, a label is added in each portion of input data block to indicate a read-and-write processing unit which operates the data block, a RAID controller corresponding to the data block, and a RAID data band which belongs to the data block.

In addition, the RAID processor broadcasts a short message to all of the read-and-write processing units to prevent the read-and-write processing units from exceeding a RAID data band. The short message includes the number of the data band which is read by the read-and-write processing unit based on the permission of the current RAID processor, and information about whether the check code of the current RAID processor could be read or not. A read-and-write processing unit controls multiple flash memory units, and when the read-and-write processing unit detects that the next operation is an illegal operation temporarily, it switches to other strings for operating another chip of the flash memory unit.

The present invention also provides a system for constructing RAID in a storage system on the basis of flash memory. The system includes one or more RAID controllers and multiple flash memory units. The RAID controller includes multiple read-and-write processing units, a data block pointer unit, a data block counter, and a parity check code buffer. The read-and-write processing unit operates one or more flash memory units. A check code scheduling instruction is submitted to a RAID processor. Submission of the instruction is initiated by a driving from a host or by hardware. The read-and-write processing unit reads data block of a current data band. The data block pointer unit is utilized to record the input position of the current data band corresponding to each respective flash memory unit. The data block counter is utilized to count the amount of operated data block. The parity check code buffer is utilized to temporarily store a parity check code. The read-and-write processing unit reads a corresponding portion of data block, calculates the parity check code according to the position of the current data block pointer, and writes the result to a corresponding position of a parity check code buffer; the data block pointer unit increases length value of input portion of data block and moves corresponding data block pointer after the calculation is finished. After finishing operation of all data block of a corresponding flash memory unit, which means that the data block pointer returns to zero, the data block counter increases the amount of finishing data blocks by one. When the recorded amount of finishing data block achieves sum of amounts of data block included by the RAID data band, data in the parity check code buffer is written to a corresponding flash memory unit. After all check codes are taken, the check code buffer is reset to zero, and calculation of the next RAID data band is started until the data operation is finished.

In addition, the RAID processor includes a short message unit to broadcast a short message to all of the read-and-write processing units to prevent the read-and-write processing units from exceeding a RAID data band. The short message includes the number of the data band which is read by the read-and-write processing unit based on the permission of the current RAID processor, and information about whether the check code of the current RAID processor could be read or not. A read-and-write processing unit controls multiple flash memory units, and when the read-and-write processing unit detects that the next operation is an illegal operation temporarily, it switches to other strings for operating another chip of the flash memory unit.

In addition, a scheduling instruction of the check code is transmitted after submitting all of data scheduling instructions of a current RAID data band and before data scheduling instructions of the next RAID data band.

By utilizing transportation of information and locking, the execution sequence between read-and-write processing units and between the strings could be distributed by the present invention, so that the accurate writing and calculation of RAID 5 becomes possible. By utilizing simple rules, when the submission and execution of instructions are asynchronous and random, the deadlock will not occur for the submitted instructions which obey the rules.

The present invention realizes the width of RAID 5 which could be distributed dynamically to meet the needs of particular applications. The independence of each read-and-write processing unit could be maintained as much as possible to maximize performance.

As illustrated above, the advantages of the present invention are that the RAID parity check code is generated by the XOR operation of multiple data blocks, and each data block is stored in independent storage units. Moreover, each data block participating in the RAID calculation is divided into at least two portions for inputting to the RAID processors, and portions of data which belong to different data blocks are input to RAID processors with time interleaving. Also, the parity check code is output by the RAID processor after inputting all data blocks which belong to the RAID group. Regarding a portion of the input position of the data block, the input position is recorded by the corresponding pointer to contain data input of interleaving, random and divisional groups within the RAID group. The data block counter is adopted to allow the amount of data blocks within the adjustable RAID group. The broadcasting of the short message is adopted by the RAID processor to distribute multiple read-and-write processing units of the flash memory, and prevent the read-and-write processing units from exceeding the operation among different RAID groups. Finally, the RAID check code could be output on the data portion which has been calculated, and it does not have to be output after all of the data input of the whole RAID group.

BRIEF DESCRIPTION OF DRAWINGS

FIG. 1 illustrates the data structure of RAID 5 of SSD;

FIG. 2 is a schematic diagram illustrating the interleaving input and random data of the data block;

FIG. 3 is a schematic diagram of the pointer location for recording data input location in the RAID processor by the present invention;

DETAILED DESCRIPTION

Figure 4:
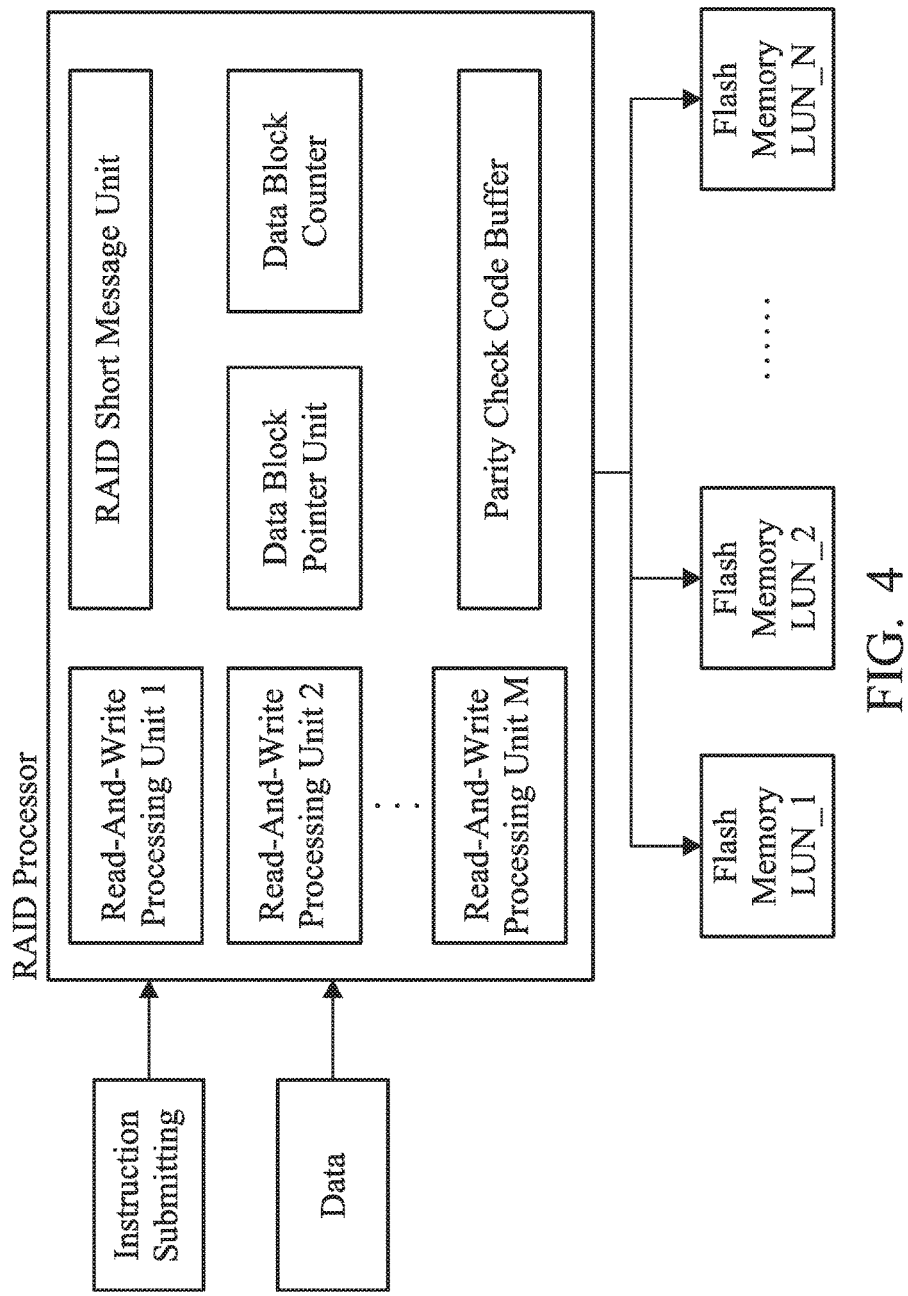
FIG. 4 is a structural diagram of the storage system based on the flash memory of RAID 5 application of the present invention.

Because the multiple data blocks D0, D1, D2 . . . of the RAID data band correspond to different respective flash memory storing units LUN, each data block will be performed by its corresponding read-and-write processing unit. In order to realize parallel processing and maximize system performance, interleaving and random input of the input of the data block will be permitted by the RAID method constructed by the present invention.

FIG. 2 illustrates the interleaving input and random data of the data block. D0, D1 and D2 represent the respective data blocks of the RAID data band, and Part0, Part1 and Part2 represent a portion data of the data block which may be 64 byte, 1 Kbyte, or other data of arbitrary length (less than or equal to the length of the data block D). For example, D2 Part0 indicates the first portion of data of the data block D2, and D1 Part2 indicates the third portion of data of the data block D1.

The purpose for calculating RAID 5 is effectively to obtain the XOR parity check code of the data block of D0, D1, D2 . . . etc. It is based on the following events:

The switching law works for the XOR operation, therefore, a data block with an upside-down sequence does not affect the accuracy of the parity check code.

Although there is interleaving for data written by different read-and-write processing units, there is no random sequence in the same data block.

A read-and-write processing unit may control multiple flash memory units and store different respective data blocks, but there is no interleaving between data blocks in the same processor.

Accordingly, in order to ensure the accuracy of the check code, the input of the constructing data of RAID 5 needs to meet the following conditions:

The data in the same RAID data band could be random, but it cannot be random between different RAID data bands.

The data in the same RAID data band could be interleaving, but it cannot be interleaving between different RAID data bands.

Transmission of the data of the next RAID data band can only be started after the check code of the current data band is taken by the processor of the check apparatus.

In the RAID system, the calculation method of the parity check code is as follows:

A label is added in each input data block to indicate the read-and-write processing unit which is processing the data block, the RAID processor corresponding to the data block, and the RAID data band which belongs to the data block.

A check code buffer is arranged within the RAID processor to set a data block pointer for the read-and-write processing unit. As shown in FIG. 3, the data block pointer is utilized to record the position of the current data block on the received input data. When the data is received, the data will perform the XOR operation with data in the check code buffer pointed by the corresponding data block pointer, and it will be written into the check code buffer. The point value is increased by the data block pointer according to the length of input data. The point value of the data block returns to zero when it reaches the length of the data block, which means that the XOR operation of a data block is completed. At the same time, the data block which is finished by the processor will be increased by one.

The processing amount of the data blocks on the current data band which is finished by the RAID processor is recorded. The check code of a portion of data bands which have been calculated is confirmed according to the processing amount of the data blocks and the position of each pointer. When the check code of a portion of data bands has been calculated, the RAID processor could inform the corresponding read-and-write processing unit to start taking the check code and write into the corresponding flash memory unit.

When all of the check codes have been taken, the buffer resets to zero, re-starts the calculation of the next RAID data band, and starts a new run of circulation.

Because only one buffer of size of a complete data block (usually 16 KB) is needed for the reservation by each RAID processor, it can be completely implemented by a SRAM inside the chip. The utilization of a DRAM outside the chip can be avoided to simplify the design.

The RAID processor broadcasts a short message to all read-and-write processing units on the message main thread, in order to prevent the read-and-write processing units from exceeding the RAID data band. The short message includes the following information: the number of the data band which is read by the read-and-write processing unit based on the permission of the current RAID processor, and information about whether the check code of the current RAID processor could be read or not.

A read-and-write processing unit could control one LUN or multiple LUNs. When the read-and-write processing unit finds that the next operation is temporarily an illegal operation (for example, corresponding to data writing of the next RAID data band), it switches to other strings and operates another flash memory unit chip. The strings of the flash memory chip with fast writing give resources to the slow strings. Therefore, the progress of each string is approximately the same.

The implementation of the method of present invention relies on decreasing the probability of illegal operations. Accordingly, each read-and-write processing unit could operate with almost full loading. The applied approach is advancing the timing point of reading the check code as much as possible. Because the read-and-write processing unit corresponding to the check apparatus usually has more leisure, the reading of the check code will be finished immediately after finishing the process of the last data block. The whole system could be on the writing of the next data band. Therefore, the window of being incapable of transmitting data is decreased.

In addition, the scheduling time of the flash memory chip is several times longer than the data transmission time, and two RADIS writing points could be operated in the system simultaneously. Therefore, even if one is temporarily forbidden, another one can still be operated. Therefore, through the estimation, the performance loss caused by the synchronizing effect of the RAID 5 is less than 5% under all kinds of environments.

When a read-and-write processing unit cannot perform the next operation (for example, the next step is an illegal operation), it will be necessary to wait for another processing unit. Accordingly, a circulation will be developed to become deadlocked. The deadlock should be strictly avoided. Deadlocks are caused by incorrect instruction execution sequences, and the execution sequence of instructions is different from the transmission sequence of instructions. Since random execution merely exists on different strings in the method of the present invention, it is executed in a strict sequence within the same string. The software transmission instruction should obey the following simple rules to avoid a deadlock:

The sequence is only required for the instructions of the RAID processor, and other instructions could be transmitted arbitrarily.

There is no sequence requirement for the data scheduling instructions within the same RAID data band.

The check scheduling instruction should be transmitted after all of the data scheduling instructions in the current RAID data band and before all of the data scheduling instructions in the next RAID data band.

FIG. 4 is a structural diagram of the storage system based on the flash memory constructed by the above method. The storage system includes a RAID processor and multiple flash memories. The RAID processor includes multiple read-and-write processing units, a RAID short message unit, a data block pointer unit, a data block counter, and a parity check code buffer. A read-and-write processing unit could control one LUN or several LUNs.

The scheduling instruction of the check code is submitted to the RAID processor. The instruction transmission could be initiated by the driving from the host, or be initiated by hardware. In order to avoid a deadlock, the instruction transmission should obey the rules determined by the RAID processor. In other words, the check scheduling instruction should be transmitted after submitting all of the data scheduling instructions in the current RAID data band and before all of the data scheduling instructions in the next RAID data band.

The read-and-write processing unit executes its corresponding instruction, and obeys the rules of the short message of the RAID controller during the execution. The read-and-write processing unit reads the data block of the current data band, and starts to read data of the next RAID data band only when the check code of the current data band is taken by the processor of the check apparatus.

The data block pointer unit is utilized to record the input position of the current data block for each respective flash memory.

The data block counter counts the number of data blocks operated by a flash memory.

The parity check code buffer is utilized to temporarily store the parity check code.

The RAID short message unit is utilized to broadcast a short message to all of the read-and-write processing units to prevent the read-and-write processing units from exceeding the RAID data band. The short message includes the following information: the data band number which is read by the read-and-write processing unit with the permission of the current RAID processor, and information about whether the check code of the current RAID processor could be read or not.

The read-and-write processing unit reads the corresponding data block, performs the XOR operation for the position of the current data pointer and the data in the parity check code buffer, and writes the data to the parity check code buffer. When the XOR operation is finished, the data block pointer unit increases the length value of the input data and moves the corresponding data block pointer.

After the corresponding flash memory LUN has finished the operation of data block which means that the data block pointer returns to zero, the data block counter increases by one.

When the data block counter achieves the sum of the data blocks included by the RAID data band, the data in the parity check code storage is written to the corresponding flash memory unit.

The RAID controller begins the calculation operation of the next RAID data band until the operation of data is finished.

Figure 5:
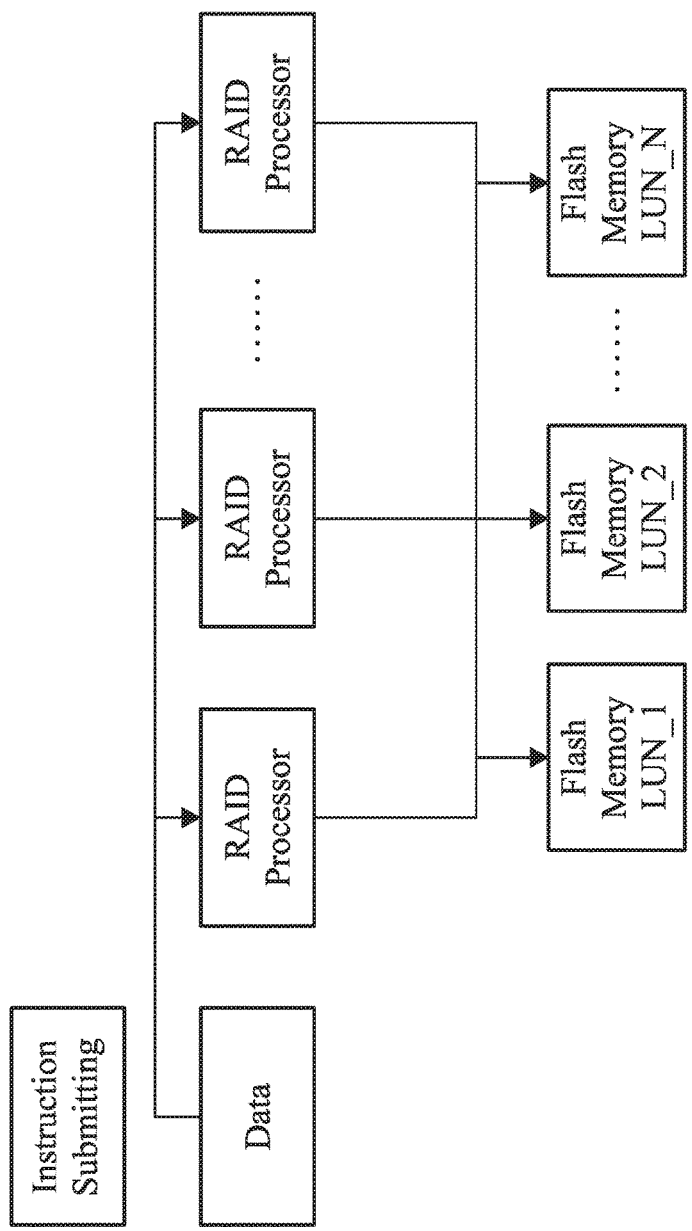
FIG. 5 is a structural diagram of the storage system based on the flash memory of multiple RAID applications of the present invention.

As illustrated before, the system could be extended to include applications with multiple RAID processors which are shown in FIG. 5. Advantages include having multiple RAID processors operate independently. Moreover, the accurate calculation and writing of the RAID is performed without the writing sequence of central control. Also, the performance loss caused by RAID is almost zero. Finally, the RAID width could be distributed dynamically.

Finally, it should be noted that the above embodiments are merely for illustrating the technical methods of the present invention, not for limitation. People skilled in the art should understand that the core features of the present invention can not only be applied in SSD, but also in arrays based on traditional disks or arrays of a storage medium of the next generation. The present invention could be implemented by FPGA, computable logics, ASIC, or specific chips. The amount of RAID writing points could be extended further if needed, and dual processors could be arranged for each of the writing points to eliminate the time window in which data transmission cannot be performed. The implementation of RAID could be RAID 5, RAID 6, or other RAID structures. People skilled in the art could amend or replace the present invention, and the amended technical embodiments will not exceed the scope and content of the present invention.

What is claimed is:

1. A method for constructing RAID in a storage system on the basis of flash memory, comprising:
    submitting a check code scheduling instruction to a RAID processor;
    reading a portion of data of data block of a current data band by a read-and-write processing unit of the RAID processor;
    setting a data block pointer to record an input position of a current data band corresponding to each respective flash memory unit;
    calculating a parity check code for the portion of data block read by the read-and-write processing unit according to a position of the current data block pointer, and writing a result to a corresponding position of a parity check code buffer;
    increasing length value of input portion of data block by the data block pointer;
    after finishing operation of all data block of a corresponding flash memory unit which means that the data block pointer returns to zero, increasing the amount of finishing data blocks by one;
    when a recorded amount of finishing data block achieves sum of amounts of data block included by the RAID data band, writing data in a parity check code buffer to a corresponding flash memory unit; and
    after all check codes are taken, resetting the check code buffer to zero, and starting calculation of the next RAID data band until finishing data operation.

2. The method as claimed in claim 1, which is characterized by: a scheduling instruction of the check code is transmitted after submitting all of data scheduling instructions of a current RAID data band and before data scheduling instructions of the next RAID data band.

3. The method as claimed in claim 1, which is characterized by: adding a label in each portion of input data block to indicate a read-and-write processing unit which operates the data block, a RAID controller corresponding to the data block, and a RAID data band which belongs to the data block.

4. The method as claimed in claim 1, which is characterized by the RAID processor broadcasting a short message to all of the read-and-write processing units to prevent the read-and-write processing units from exceeding a RAID data band, wherein the short message includes the number of the data band which is read by the read-and-write processing unit based on the permission of the current RAID processor, whether the check code of the current RAID processor could be read or not.

5. The method as claimed in claim 4, which is characterized by a read-and-write processing unit controlling multiple flash memory units, and when the read-and-write processing unit detects that the next operation is an illegal operation temporarily, it switches to other strings for operating another chip of flash memory unit.

6. A system for constructing RAID in a storage system on the basis of flash memory, the system comprising one or more RAID controllers and multiple flash memory units,
wherein the RAID controller comprises multiple read-and-write processing units, a data block pointer unit, a data block counter, and a parity check code buffer;
the read-and-write processing unit operates one or more flash memory units;
a check code scheduling instruction is submitted to a RAID processor, and submission of the instruction is initiated by a driving from a host or by hardware;
the read-and-write processing unit reads data block of a current data band;
the data block pointer unit is utilized to record the input position of a current data band corresponding to each respective flash memory unit;
the data block counter is utilized to count amount of operated data block;
the parity check code buffer is utilized to temporarily store a parity check code;
the read-and-write processing unit reads corresponding portion of data block, calculates the parity check code according to the position of a current data block pointer, and writes a result to a corresponding position of a parity check code buffer;
the data block pointer unit increases length value of input portion of data block and moves corresponding data block pointer after the calculation is finished;
after finishing operation of all data block of a corresponding flash memory unit which means that the data block pointer returns to zero, the data block counter increases the amount of finishing data blocks by one;
when a recorded amount of finishing data block achieves sum of amounts of data block included by the RAID data band, data in a parity check code buffer is written to a corresponding flash memory unit; and
after all check codes are taken, the check code buffer is reset to zero, and calculation of the next RAID data band is started until data operation is finished.

7. The storage system on the basis of flash memory as claimed in claim 6, which is characterized by a RAID processor that comprises a short message unit to broadcast a short message to all of the read-and-write processing units to prevent the read-and-write processing units from exceeding a RAID data band, wherein the short message includes the number of the data band which is read by the read-and-write processing unit based on the permission of the current RAID processor; whether the check code of the current RAID processor could be read or not.

8. The storage system on the basis of flash memory as claimed in claim 7, which is characterized by a read-and-write processing unit that controls multiple flash memory units, and when the read-and-write processing unit detects that the next operation is an illegal operation temporarily, it switches to other strings for operating another flash memory unit chip.

9. The storage system on the basis of flash memory as claimed in claim 6, which is characterized by a scheduling instruction of the check code being transmitted after submitting all of data scheduling instructions of a current RAID data band and before data scheduling instructions of the next RAID data band.

* * * * *

UNITED STATES PATENT AND TRADEMARK OFFICE
CERTIFICATE OF CORRECTION

PATENT NO.        : 9,720,770 B2
APPLICATION NO.   : 15/021993
DATED             : August 1, 2017
INVENTOR(S)       : Zhou et al.

It is certified that error appears in the above-identified patent and that said Letters Patent is hereby corrected as shown below:

On the Title Page

Item [54] delete "RAIDS" and insert therefor --RAID5--.

Signed and Sealed this
Fifth Day of September, 2017

Joseph Matal
*Performing the Functions and Duties of the*
*Under Secretary of Commerce for Intellectual Property and*
*Director of the United States Patent and Trademark Office*